United States Patent [19]
Heil et al.

[11] Patent Number: 4,459,639
[45] Date of Patent: Jul. 10, 1984

[54] CIRCUIT BOARD HEATSINK CLAMPING ASSEMBLY AND TECHNIQUE

[75] Inventors: Dale L. Heil, Marion; Mark D. Goodsmith, Cedar Rapids, both of Iowa

[73] Assignee: Rockwell International Corporation, El Segundo, Calif.

[21] Appl. No.: 397,645

[22] Filed: Jul. 12, 1982

[51] Int. Cl.³ .................................................. H05K 7/20
[52] U.S. Cl. ..................................... 361/386; 361/388
[58] Field of Search ............... 361/386, 387, 388, 395, 361/399, 414; 174/52 R, 72

[56] References Cited

U.S. PATENT DOCUMENTS

| Re. 29,683 | 6/1978 | Ocken | 174/52 R |
|---|---|---|---|
| 3,124,640 | 3/1964 | Armstrong | 174/72 |
| 3,354,542 | 11/1967 | Maillia | 29/625 |
| 3,509,429 | 4/1970 | Graig et al. | 174/72 |
| 3,531,579 | 9/1970 | Katz | 174/68.5 |
| 3,585,455 | 6/1971 | Naylor | 361/407 |
| 3,758,350 | 9/1973 | Weglin | 156/8 |
| 4,029,999 | 6/1977 | Neumann et al. | 361/386 |
| 4,204,248 | 6/1980 | Proffit et al. | 361/388 |
| 4,298,904 | 11/1981 | Koenig | 361/386 |

FOREIGN PATENT DOCUMENTS 1365877  9/1974  United Kingdom ............... 361/387

Primary Examiner—J. V. Truhe
Assistant Examiner—Greg Thompson
Attorney, Agent, or Firm—George A. Montanye; H. Fredrick Hamann

[57] ABSTRACT

A technique and assembly is disclosed which allows more effective heat dissipation in a printed circuit assembly. A heatsink plate is etched using the artwork or masks used to form the conductive strips and terminals on a conventional printed circuit board. The heatsink plate is secured over at least a portion of the surface of the printed circuit board by an adhesive and the resulting heatsink assembly is mounted adjacent to a thermally conductive bracket. The heatsink assembly is then secured to the bracket by a wedge clamp which includes mating wedges configured to provide a high thermally conductive path between the heatsink plate and bracket for dissipating heat generated in or about the printed circuit heatsink assembly. The clamp configuration is such as to allow slidable movement between similarly shaped wedges which produces proper formation of the thermally conductive path during clamping.

The Government has rights to this invention pursuant to contract No. F04701-79-C-0083, awarded by the Department of the Air Force.

13 Claims, 2 Drawing Figures

CIRCUIT BOARD HEATSINK CLAMPING ASSEMBLY AND TECHNIQUE

BACKGROUND OF THE INVENTION

The present invention relates to heat dissipating structures and techniques and more particularly to a heatsink assembly for coupling and dissipating heat from a printed circuit through its mounting bracket.

In current high technology electronic apparatus, much of the circuitry is being provided by individual printed circuit boards constructed to accomplish a particular purpose and configured to be easily mounted and removed from the electronic apparatus. Each of the circuit boards includes a plurality of electronic components interconnected through terminals and conductive patterns on the printed circuit board to produce a desired circuit. As the complexity of the devices has increased, so have the circuits and number of components required to produce specific functions. Along with the increase in the number of components and the complexity of the circuits, the heat generated due to the increased power requirements has also increased. Because of the trend toward reduced size and limited space in which to mount the printed circuits, problems have arisen because of the inability to properly dissipate heat and maintain the components in a controlled temperature environment for extended life and reliability of operation.

A variety of techniques have been proposed to overcome the problems associated with increased heat generation. One such known technique employs individually screened and photoetched pads on one side of a particular electronic module to produce heat sinking areas similar in configuration to those circuit areas on an opposite side of that module. The pads are first formed and then dimensioned by solder-dipping or any other process capable of increasing the size and configuration of the heat dissipating pads. While improvements in heat dissipation may be obtained, the processes required to form the heat sinking areas are complex and still result in heat dissipation primarily by air convection at an inefficient rate.

In still other techniques, thermally conductive pads are molded to fit over the electronic components on individual printed circuit boards and maintained in contact with those components to thermally conduct heat away from the printed circuit board. In such structures, the pad is formed separately to have recesses similar in configuration to the components secured to the printed circuit board and is subsequently attached to the individual board prior to its mounting and coupling in the electronic apparatus. A heatsink is then positioned adjacent and in thermal contact with the thermal pad to conduct heat generated by the electronic components from the electronic apparatus. While this may again provide improved heat dissipation, the thermal pad is cumbersome, takes up a relatively large area, and must be maintained in a specific and aligned relationship with respect to the structure used to carry away the heat.

In still another example of prior art techniques, the circuit board itself is constructed so that the conductive areas interconnecting the terminals to which the electronic components are attached are themselves increased in surface area. The increased surface area of those conductive areas carries away the heat generated by electrical currents or heat absorbed from the electronic components. Alternatively, a conductive plate may be positioned on the side of the printed circuit board opposite to that containing the conductive areas and in contact therewith. In such an instance, non-conductive areas are formed on the surface of the conductive plate in contact with the printed circuit board to prevent electrical shorting at the terminal areas. In either case, heat dissipation is still primarily provided by air convection which is a relatively inefficient technique, especially in view of the surface areas involved in the printed circuit board.

In each of the above instances, the special structures required prohibit the formation of a printed circuit board and heatsink assembly which may be mounted in a variety of units in such a way that the printed circuit boards may be readily changed yet still provide efficient heat dissipation. There is therefore a need to provide an assembly and structure which will allow simplified mounting of printed circuit assemblies so that heat may be conducted away from the area of the printed circuit board to allow heat dissipation in areas other than adjacent the circuit boards or components themselves. There is also a further need for assemblies and structures which are capable of allowing easy insertion and removal of the printed circuit assemblies to facilitate easy repair and replacement of electronic circuits and components during operation of an electronic apparatus.

Accordingly, the present invention has been developed to overcome the specific shortcomings of the above known and similar techniques and to provide a printed circuit heatsink assembly which provides improved heat dissipation in crowded circuit environments.

SUMMARY OF THE INVENTION

In accordance with the invention, a circuit heatsink assembly is constructed which includes a thermally conductive plate secured to at least a portion of the surface of a circuit board. The plate may be formed by etching one surface of the plate using the same artwork or mask employed to form the conductive strips and terminals on the surface of the circuit board and etching the surface on an opposite side of the plate using the same artwork employed to form the terminals. The plate is etched to produce a pattern which allows mating of the plate and circuit board so that the conductive and terminal areas do not electrically short to the thermally conductive plate. The resulting circuit heatsink assembly is then mounted to a thermally conductive bracket by use of an improved clamp having cooperating wedges. The wedges are configured to engage the plate and mounting bracket to form a thermally conductive path for effectively conducting the heat generated in the vicinity of the circuit heatsink assembly to an area away from the assembly and attached electronic components. The clamp includes two triangularly shaped wedges, each having a wedge surface cooperating with that of the other wedge to produce a sliding engagement of one wedge on the plate until it thermally contacts the mounting bracket. The clamp allows heat transfer between the plate and mounting bracket to dissipate the heat generated in the plate through the mounting bracket. The clamp is simple in construction and when combined with the circuit board assembly, more effectively dissipates the heat generated by electronic components over those techniques known in the prior art.

It is therefore a feature of the invention to provide a simple and inexpensive technique and assembly for providing improved heat dissipation in circuit boards.

It is a further feature of the invention to provide a heatsink and clamping assembly which thermally conducts heat from a printed circuit board to a mounting bracket.

Still another feature of the invention is to provide an improved clamp and printed circuit heatsink assembly for allowing easy insertion and removal of a printed circuit board in a thermally conductive mounting bracket.

Yet another feature of the invention is to provide an adjustable clamping and printed circuit heatsink assembly which allows improved thermal contact between a heatsink and thermally conductive mounting bracket.

These and other advantages and novel features of the invention will become apparent from the following detailed description when considered with the accompanying drawings wherein:

DETAILED DESCRIPTION OF A PREFERRED EMBODIMENT

Figure 1:
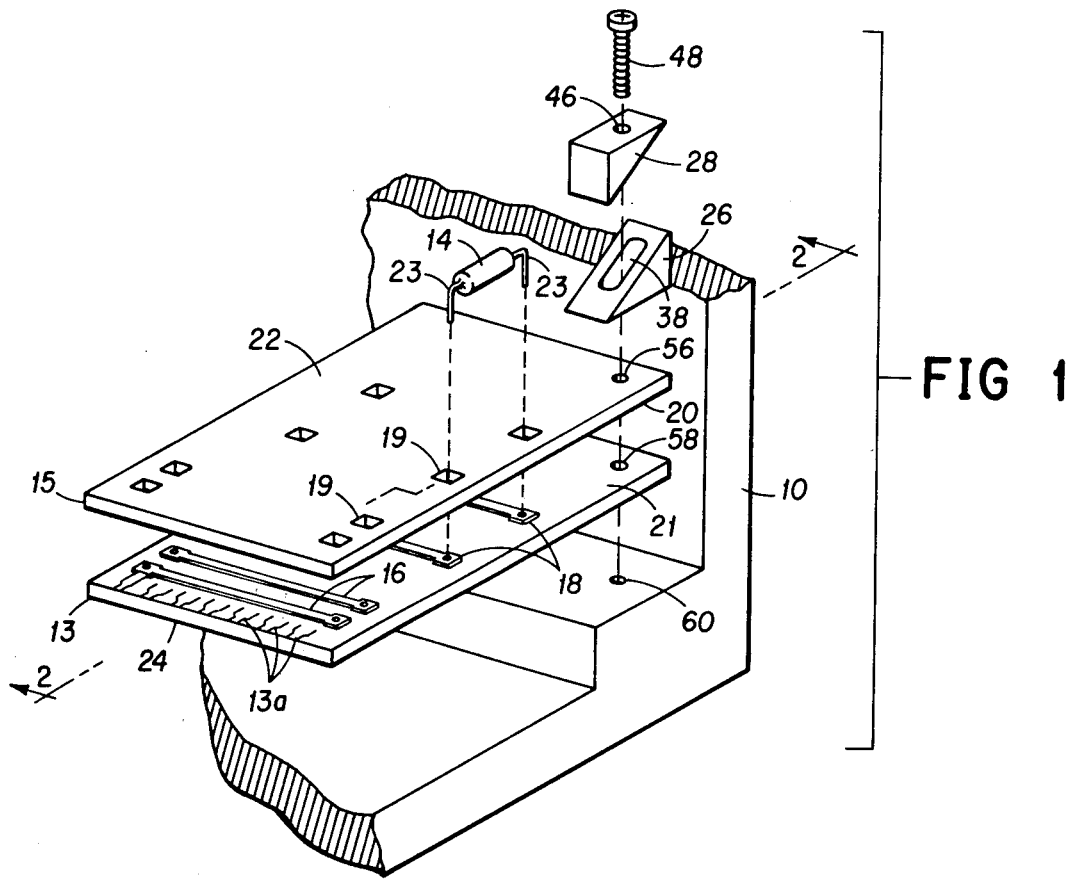
FIG. 1 is an exploded perspective view of the printed circuit and heatsink assembly in accordance with the present invention.

Referring now to the drawings, wherein like numerals are used to refer to like elements throughout, one embodiment of the improved circuit heatsink assembly and technique is disclosed. It should be noted that although the invention will be described with reference to conventional printed circuits, the teachings are equally applicable to circuit boards and structures formed using similar or newly developed techniques in spite of a difference in the name of such structures or techniques. In FIG. 1, a printed circuit board mounting bracket 10 is schematically shown which may include any configuration of conventional bracket as may normally be employed for mounting and securing a printed circuit board in an electronic apparatus. The bracket 10 may be formed in a variety of configurations, but in the example shown, includes a first end which includes an output connector (not shown). The output connector may be either a female or male connector which conventionally includes a plurality of conductors which are attached to wires or other conductive members for distributing the electrical signals from printed circuit boards throughout the electronic apparatus. The exact structure of the output connector may be one of a variety of conventional connectors and is not critical to a further understanding of the present invention.

A printed circuit board 13 includes a mating connector 13a which again may be a male or female connector depending upon the structure of the output connector. Connector 13a, as shown, may include a plurality of conductive outputs for mating with the corresponding conductors in the output connector to distribute the signals from the printed circuit board 13 to the wires or conductive members from the output connector. The conductive outputs of connector 13a are coupled to receive the appropriate electrical signals from different parts of the circuits on the printed circuit board in a conventional manner.

The printed circuit board 13 may be conventionally formed by a variety of processes which enable the formation of electrically conductive strips 16 and terminals 18 at predetermined positions on the board to form circuit configurations. Electronic components are then electrically coupled to the terminals to form the individual electronic circuits produced by the printed circuit boards 13. In the present example, the electronic components, as depicted by resistor 14 in FIG. 1, may have their leads situated such that they extend through plated-through holes in the printed circuit board forming the terminals 18. The leads, extending through to an opposite side of the board, are then wave soldered or otherwise attached by a conventional soldering process. After all of the electronic components have been attached to their appropriate terminals, the printed circuit board 13 is considered complete and is then inserted to couple connector 13a to the output connector to produce the desired electronic controls.

In the prior art, the above construction and configuration is conventional and forms the basic printed circuit assembly which provides the electronic control for the particular device involved. One or more printed circuit boards may be mounted on the bracket 10 adjacent to one another in which case separate mounting structures and output connectors are used to accommodate each of the boards. Such techniques are again conventional and do not form a part of the present invention and thus require no further description for an understanding thereof. In prior art structures, heatsinks were used in connection with the printed circuits to produce the desired heat dissipation and prevent damage to the electronic components. Depending upon the heat sinking technique employed, the printed circuit board required extensive modification prior to or subsequent to its attachment in the mounting bracket 10. In other instances a special mounting bracket was required to accommodate the special heatsink structures. In any event, the aforementioned prior art techniques required substantial and complex steps in an attempt to produce effective heat dissipation in the electronic apparatus.

In accordance with the present invention, heat dissipation from the printed circuit board 13 and the electronic components as depicted by resistor 14 is provided in a simplified and more efficient manner which does not require extensive modification to the steps used in the formation of the printed circuit assembly. In the described embodiment, the conventional artwork or mask used in the process of forming the conductive strips 16 and terminals 18 on the printed circuit board 13 is used to form a heatsink plate 15 for attachment to the printed circuit board 13 for providing a printed circuit heatsink assembly which facilitates heat dissipation. As was previously mentioned, the printed circuit board 13 may be formed by a variety of conventional processes. In processes producing the conductive strip and terminal areas 16 and 18, respectively, a mask or other artwork of some form is first used to define a pattern of the areas on the surface of the board 13 on which terminals 18 and conductive strips 16 are to be formed. The artwork or mask may be a conventional photoresist mask or similar layer in which are defined the patterns for producing the areas which will form the terminals 18 and conductive strips 16. The term artwork or mask is also intended to include computer-generated patterns (as are employed in numerically controlled machining or etching techniques) and any other technique or structure which defines the pattern areas. Again, the particular technique involved is not critical to the understanding and practice of the present invention, it being understood that any process which utilizes such artwork or masks is compatible with the practice of the present technique and the formation of the inventive printed circuit heatsink assembly.

Figure 2:
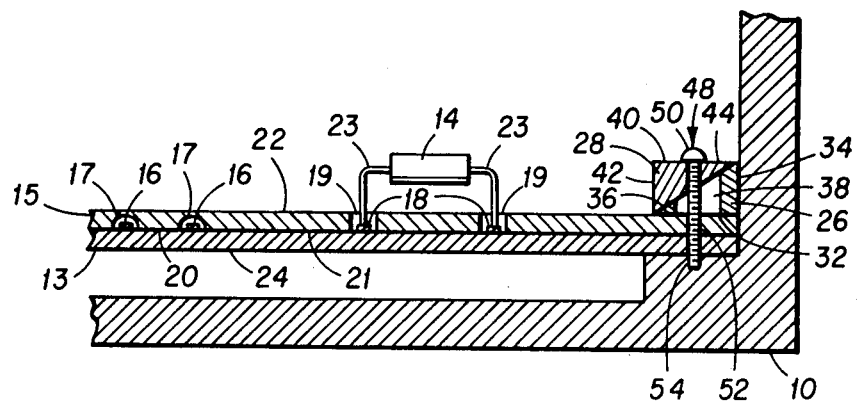
FIG. 2 is a side sectional view taken along line 2—2 in FIG. 1.

Referring again to FIG. 1, a thermally conductive member 15 may be formed by etching or milling a thermally conductive plate to remove material from one face in a pattern which corresponds to the pattern of conductive strips 16, and from both faces in a pattern which corresponds to the pattern of terminals 18 on the surface of printed circuit board 13. The etching or milling is preferably performed by chemical etchants but may be accomplished by any technique (e.g. laser etching, etc.) capable of providing the pattern of etched areas as described. More specifically, the mask used to produce the conductive strips 16 and terminals 18 may be used to produce the patterns necessary for etching plate 15 to form the removed areas. As can be seen with reference to FIG. 2, the purpose of the etching is to produce indentations in the form of channels 17 and holes 19 in the same pattern as the corresponding face of the printed circuit board 13. When the etching is performed, the etched areas 17 will be in the configuration of channels which enclose conductive strips 16 while holes 19 will surround terminals 18. When combined to form the printed circuit assembly, the plate 15 will be mounted adjacent to the printed circuit board 13 so that the etched channels 17 and holes 19 are in opposed and aligning relationship to produce electrical isolation of the plate 15 from those conductive areas 16 and 18 on the printed circuit board 13.

In order to produce the assembly, the etched plate 15 may be adhesively bonded to the printed circuit 13 so that the surface 20 of plate 15 is in thermal contact with the surface 21 of board 13 in all areas except those defined by areas 17 and 19. The adhesive may be any of a conventional type which is generally an electrically insulating material yet exhibits sufficient thermal conductivity so that when the assembly is cured, the plate 15 and board 13 are in thermally conductive contact with one another across the surface area of their mating sides 20 and 21. The adhesive may, for example, be a 0.001–0.002 layer of material identified as SPEED-BONDER 324 adhesive with a 707 activator as supplied by Loctite, Inc. of Newington, Conn.

In one example of the plate 15, the plate is formed in a generally rectangular configuration having opposed parallel planar surfaces 20 and 22. The plate 15 may be constructed to have the same surface dimensions in width and length as the board 13 to which it is to be mated. Naturally, the surface 21 of the board 13 on which the conductive strips 16 and terminals 18 are formed is also normally planar and makes substantially uniform contact with the surface 20 of the plate 15 when the assembly is complete. After bonding, the plate 15 and printed circuit board 13 form a single structure which comprises the printed circuit heatsink assembly. It is apparent that while the present invention has been described with reference to the planar-rectangular printed circuit board 13 and plate 15, other configurations could be employed consistent with the inventive teachings.

In forming the channels 17 and holes 19, the artwork or mask used to form the conductive strips 16 and terminals 18 on board 13 may be positioned on the surface 20 to define patterns corresponding to the areas 16 and 18 in a manner similar to that used with respect to board 13. After the patterns are defined, the surface 20 may be etched with conventional chemical etchants to form the channels 17 and partial holes 19. The pattern of channels 17 and partial holes on surface 20 is shown more particularly in a co-pending application filed on even date herewith entitled "Circuit Board Heatsink Assembly and Technique" assigned to the same assignee as this application and hereby incorporated by reference in its entirety. The top surface 22 of the plate 15 may also be masked with the same artwork used on surface 20 except that the pattern areas defining the conductive strips 16 in the original mask are removed so that only the pattern areas defining terminals 18 remain and form patterns on surface 22. The surface 22 may then be chemically etched and the resulting etching completes the formation of holes 19 in a pattern corresponding to that of the terminals 18 on the printed circuit board 13. Alternatively, both surfaces 20 and 22 could be masked and etched together to form the channels 17 and holes 19.

The pattern corresponding to the terminal areas 18 on surface 22 of plate 15 is also more particularly shown in the aforementioned co-pending application. As can be understood, during the etch of surface 20, approximately one-half of the hole 19 will be formed. Etching of the top surface 22 completes the formation of the holes 19 in areas corresponding to the positions of the terminals 18. The holes 19 could alternatively be formed by using different chemical etchants in the respective areas 16 and 18, but this would entail more complicated procedures using etchants with different etching rates. Although such a technique is acceptable, it is desirable to produce the etched areas 17 and 19 in the simplest and most efficient manner, and to that end, any technique using the original artwork or mask may be employed.

In order to produce the channels 17 and holes 19 of a size which will prevent electrical contact between the plate 15 and conductive areas 16 and 18, the artwork or mask may first be grown or photographically enlarged by a predetermined amount to produce patterns of greater dimension. Thus, in defining patterns on the surfaces 20 and 22, the original artwork or mask may be modified in conventional manner by, for example, 0.02 inches, to produce an oversize pattern area in contrast to that originally used for the production of the conductive strips 16 and terminals 18. When the etching is then performed on the surfaces 20 and 22, the material removed to form channels 17 and holes 19 will be sufficient to preclude electrical contact between the plate 15 and conductive areas 16 and 18 when the surface 20 is bonded in thermal contact with the surface 21 of printed circuit board 13. Although modification of the artwork or mask is one exemplary technique for providing greater dimensions for the channels 17 and holes 19, any other technique may be used to produce the same increase in dimensions. Thus, for example, the etchant used may be such that the areas 17 and 19 are naturally increased in size prior to the achievement of the proper depth and thus inherently produce oversize areas 17 and 19 for electrically insulating the channels 17 and holes 19 from the conductive strips 16 and terminals 18, respectively.

After the attachment of plate 15 to printed circuit board 13 is complete, the electronic components, as exemplified by resistor 14, are attached to the board 13 by insertion of their electrical leads 23 through the holes 19 and into contact with terminals 18. Terminals 18 may be conventional plated-through holes in which case the leads 23 are positioned to extend through terminals 18 to the opposite surface 24 of board 13. The surface 24 is then soldered to securely and electrically couple the leads 23 of the electronic components 14 to the terminals 18. By way of example, the surface 24 of the printed circuit board 13 may be wave soldered with the leads extending through the terminals 18 to the surface 24 thereby interconnecting all of the terminals and leads of the electronic components in their appropriate manner. Any other conventional technique for bonding the electronic components to their respective terminals 18 may also be employed as long as it is compatible with the presence of the plate 15 and will not cause subsequent electrical coupling between conductive areas 16 and 18 and plate 15.

Once the electrical components have been bonded to their respective terminals, the printed circuit heatsink assembly may then be mounted to the mounting bracket 10. In accordance with the present invention, the bracket 10 is formed of a thermally conductive material, in a conventional configuration for receiving board 13. The bracket 10 may be a metal electrical conductor such as copper which is also a good thermal conductor to additionally provide grounding for printed circuit board 13. In order to provide a good thermally conductive path between the plate 15 and mounting bracket 10, an assembly including wedge elements 26 and 28 forms a clamp wherein the wedge element 26 is maintained in forceful thermally conductive contact with the surface 22 of plate 15 and in forceful thermally conductive contact with a planar surface 30 of thermally conductive mounting bracket 10.

The wedge 26 includes a first planar surface 32 which slidably contacts surface 22 of plate 15, and a second planar surface 34 which contacts surface 30 of bracket 10. The wedge 26 also includes a third planar surface 36 which interconnects surfaces 32 and 34 to form the triangular wedge 26. As can be seen, each of the surfaces 32 and 34 are substantially perpendicular to one another while the surface 36 is oriented to intersect surfaces 32 and 34 in such manner as to form the hypotenuse of triangular wedge element 26. The element 26 includes a slotted hole 38 which has an axis generally perpendicular to the surface 32 and parallel to the surface 34 and centrally located in the wedge 26 to extend through the surfaces 32 and 36.

The mating wedge 28 is formed of a similarly shaped element and includes substantially perpendicular first and second planar surfaces 40 and 42 and a third planar surface 44 which intersects planes 40 and 42 to form the hypotenuse of the triangular wedge element 28. The element 28 includes an opening 46 having an axis which extends generally perpendicular to the surface 40 and which extends through surface 40 and 44 for receiving the shaft or a threaded member, such as a screw or bolt 48. In construction, the wedge element 28 is made of generally smaller dimensions than the wedge element 26 so that the surface 44 measured along the hypotenuse of the triangle in the cross-section of the element 28 is of less length than the hypotenuse of the triangle formed by surface 36 in the cross-section of wedge element 26. The width of the wedge elements measured across the face of the surfaces 36 and 44 may be the same to produce an area of sliding contact between surfaces 36 and 44.

In operation, the threaded member 48 having a head 50, shaft 52 and threaded end 54, is inserted through the hole 46 in wedge element 28 so that it extends through the slotted opening 38 in the wedge element 26. At the same time, the surfaces 36 and 44 are positioned adjacent one another in sliding contact and oriented so that the surfaces 32 and 40 are substantially parallel to one another. The shaft 52 of member 48 is received in openings 38 and 46 and extends along an axis perpendicular to the surfaces 20, 21, 22 and 24. Openings 56 and 58 are formed in plate 15 and board 13, respectively, to receive the shaft 52 so that threaded end 54 may engage a mating threaded hole 60 in mounting bracket 10. When the member 48 is threaded into hole 60 in one direction, the force exerted by the head 50 on surface 40 will cause a force to be exerted through surfaces 44 and 36 causing the movement of wedge 26 parallel to the surface 22 of plate 15 and in a direction towards the surface 30 of mounting bracket 10. As the member 48 is rotated further, the wedge 26 will be forced to a position where its surface 34 is in planar and thermally conductive contact with the surface 30. Several of the wedge assemblies including elements 26 and 28 may be used along the width of plate 15 to provide the clamping and heat conduction. Alternatively, the wedge 26 could extend the complete width of the pate 15 to provide a greater conductive area of contact for heat conduction. In this instance, a plurality of smaller wedges 28 could be used to force the single extended wedge 26 into contact with the bracket 10 (in a manner similar to that described). A single wedge 28 having dimensions similar to the extended wedge 26 could also be used.

The wedge 26 may be constructed of any highly thermal conductive material such as copper to provide efficient heat transfer between plate 15 and mounting bracket 10. The wedge 28 may be made of any conventional material sufficient to provide and allow good sliding contact between surfaces 36 and 44 for movement of wedge 26 into thermally conductive contact with bracket 10. Thus, the wedge 28 may be made of aluminum to provide the sliding contact and reduce the weight of the structure. As can be seen, the movement of wedge 26 is facilitated by slot 38 so the slot 38 must be of such dimension as to allow sufficient movement of wedge 26 with respect to wedge 28 and toward bracket 10 so that the surfaces 34 and 30 can forcefully engage one another. The clamp structure thus allows simple and effective thermal coupling between the plate 15 and bracket 10 for conducting heat produced in plate 15 (by electronic components 14 and in other portions of the printed circuit board 13 in which plate 15 is in contact) to the mounting bracket 10 for dissipation away from the circuit board. The clamp and printed circuit heatsink assembly allow easy insertion and removal of the printed circuit heatsink assembly for repair or replacement.

As can be seen from the above description, the technique and printed circuit heatsink assembly described above provides improved capabilities for dissipating heat in printed circuit boards. The process of forming the plate 15 requires only small or no modifications to the artwork or masks already used in the formation of the conventional printed circuit board 13. Thus, with only minor changes, an effective heatsink can be formed for dissipating greater amounts of heat in the printed circuit board 13. Use of the already-formed artwork or mask enables a cheaper production of the assembly with additional economies being achieved by the chemical milling processes. The resulting structure covers a greater portion of the printed circuit board and thereby absorbs and distributes a greater amount of the total heat produced by the electronic components or the current flowing in the conductive areas of the circuit board. By interposing plate 15 between the electronic components (which produce most of the heat generated) and the printed circuit board 13, the heat is more readily and efficiently dissipated. The plate 15 bridges the conductive areas on the printed circuit board so that heat is removed from previously isolated parts of the printed circuit boards. Further, the possibility of shorts may be easily reduced by a simple process which modifies the dimensions of the artwork or mask prior to the milling or etching of the plate 15. The plate 15 may be primarily formed from an easily etched material such as copper, and then coated with a good thermally conductive material such as nickel, to produce a structure which in combination with the simple clamp facilitates heat transfer between the printed circuit board and mounting bracket 10. The improved efficiency of heat transfer enables more dense component interconnection on individual printed circuit boards and a closer stacking of the boards themselves on mounting bracket 10. The mounting bracket 10 may itself be cooled by air convection or other conventional liquid-cooled coupling techniques to remove the heat from the electronic apparatus. All of these are advantages that are unrecognized in the prior art.

Although the invention has been described with reference to particular configurations and structures, it is apparent that other configurations and structures could be used without departing from the above teachings. Specifically, the configuration of the connectors and mounting bracket could be changed to accommodate multiple boards while employing the same teachings of the present invention. Likewise, the electronic components could be mounted to the printed circuit board after the plate is in place using any conventional technology or techniques. The bracket 10 may include a structure enabling multiple printed circuit heatsink assemblies to be mounted in thermally conductive relationship in accordance with the above teachings. Likewise, the materials forming the heatsink and wedge structures may be changed so long as the heatsink functions are performed in accordance with the teachings herein.

Obviously, many other modifications and variations of the present invention are possible in light of the above teachings. It is therefore to be understood that within the scope of the appended claims, the invention may be practiced otherwise than as specifically described.

What is claimed is:

1. A circuit board heatsink assembly comprising:
   a circuit board having a pattern of electrically conductive areas on at least one surface of said circuit board;
   a thermally conductive member having one surface coupled to at least a portion of the surface of said circuit board, said member having patterns in its one surface corresponding to the patterns of said electrically conductive areas and configured so that said electrically conductive areas are electrically isolated from said member;
   means for receiving and mounting said circuit board and providing a thermally conductive medium for heat transfer; and
   means for securing said circuit board to said means for mounting and providing a thermally conductive path between said member and said means for mounting.

2. The assembly of claim 1 wherein said circuit board is a printed circuit board.

3. The assembly of claim 1 wherein the pattern of electrically conductive areas on said at least one surface of said circuit board are formed as conductive strips and conductive terminals selectively interconnected by said conductive strips.

4. The assembly of claim 1 wherein said member is an electrically conductive plate having opposed planar surfaces, one of which form said one surface for coupling to at least a portion of the surface of said circuit board, said plate being constructed to have indentations forming said patterns in its one surface and being coupled to said circuit board by an adhesive.

5. The assembly of claim 4 wherein the indentations in said member corresponding to the terminal conductive areas are holes forming openings between the opposed planar surfaces of said plate.

6. A printed circuit heatsink assembly comprising:
   a printed circuit board having a pattern of electrically conductive areas on at least one surface of said printed circuit board;
   a thermally conductive member having one surface coupled in thermally conductive contact with at least a portion of the one surface of said printed circuit board, said member having patterns of indentations in its one surface corresponding to the patterns of said electrically conductive areas and positioned over said electrically conductive areas so that the patterns of indentations and electrically conductive areas are aligned to electrically isolate the electrically conductive areas from said member;
   means for receiving and mounting said printed circuit board and providing a thermally conductive medium for heat transfer; and
   means for securing said printed circuit board to said means for mounting and providing a thermally conductive path between said member and said means for mounting, said means for securing including a pair of cooperating wedge elements slidably retained in forceful contact with one another and cooperating to produce said thermally conductive path.

7. The assembly of claim 6 wherein said wedge elements comprise:
   a first triangularly shaped thermally conductive wedge having first and second planar surfaces perpendicularly intersecting one another and a third planar surface intersecting said first and second planar surfaces to form the hypotenuse of said triangularly shaped wedge;
   a second triangularly shaped thermally conductive wedge having first and second planar surfaces perpendicularly intersecting one another and a third planar surface intersecting said first and second planar surfaces to form the hypotenuse of said second triangularly shaped wedge, said first and second wedges being oriented such that said first planar surfaces of said first and second wedge are parallel to one another, and said third surfaces are positioned in slidable contact with one another, said first surface of said first wedge being positioned in sliding contact with a surface of said thermally conductive member; and means for applying a force to said second wedge for causing movement of said first wedge along the surface of said thermally conductive member and into contact with said means for mounting for forming said thermally conductive path.

8. The assembly of claim 7 wherein said second wedge includes an opening extending perpendicular through said first surface and through said third surface, said first wedge includes a slotted opening extending through said third surface and perpendicularly through said first surface, and further wherein said means for applying a force comprises a threaded member having a head and a shaft attached at one end to the head and being threaded at an opposite end, said threaded member being positioned such that its shaft extends through the opening in said second wedge and the slotted opening in said first wedge so that its threaded end is received by said means for mounting, said head engaging said second wedge such that a force is imparted to said second wedge against said first wedge upon rotation of said threaded member.

9. A method of providing improved heat dissipation in a circuit assembly comprising:

forming a circuit board having a pattern of electrically conductive areas on at least one surface of said circuit board;

forming a thermally conductive member having a pattern of indentations in at least one surface corresponding to the pattern of electrically conductive areas on said circuit board;

positioning said at least one surface of said thermally conductive member over at least a portion of the at least one surface of said circuit board so that said member and said circuit board are thermally conductively coupled and aligned so that the patterns of indentations and patterns of electrically conductive areas cooperate to produce electrical isolation between said electrically conductive areas and said member;

mounting said circuit board adjacent a thermally conductive mounting member; and securing said circuit board to said mounting member by means of an adjustable pair of cooperating wedge elements constructed to produce a thermally conductive path between said thermally conductive member and said mounting member.

10. The method of claim 9 wherein said step of providing a circuit board comprises providing a printed circuit board.

11. The method of claim 10 wherein said step of securing further comprises positioning said pair of wedge elements such that a first wedge element of said pair slidably engages said thermally conductive member and a second wedge element of said pair slidably engages said first wedge element and applying a force to said second wedge element to slidably move said first wedge element on said thermally conductive member and into simultaneous contact with said thermally conductive mounting member to form said thermally conductive path.

12. The method of claim 10 wherein said step of forming said printed circuit board comprises forming said printed circuit board by use of a mask for defining the patterns of electrically conductive areas, and further wherein said step of forming said thermally conductive member comprises forming the pattern for said indentations with the same mask used to define the pattern of electrically conductive areas.

13. The method of claim 12 wherein said step of forming said circuit board includes the step of forming said electrically conductive areas as conductive strips and conductive terminals, and further wherein said step of forming said thermally conductive member comprises forming said indentations as holes in said thermally conductive member in those areas corresponding to terminals on said printed circuit board.

* * * * *